3,439,290
GUNN-EFFECT OSCILLATOR
Masaichi Shinoda, Sagamihara-shi, Japan, assignor to Fujitsu Limited, Kawasaki, Japan, a corporation of Japan
Filed May 26, 1966, Ser. No. 553,214
Claims priority, application Japan, May 27, 1965, 40/31,268
Int. Cl. H03b 7/06
U.S. Cl. 331—107 8 Claims My invention relates to solid-state oscillators utilizing the so-called Gunn effect.

An application for a patent on the same invention was filed in Japan, May 27, 1965, Ser. No. 40/31,268, and a right of priority based upon the Japanese application is claimed.

The present invention will be described hereinafter with reference to the accompanying drawing, wherein:

FIG. 1, relating to prior art, is explanatory;

It is known that, when voltage is applied to a short piece of electron-conducting semiconductor III-V compound, particularly GaAs or InP, and the resulting electric field in the semiconductor exceeds a well defined critical value at which the drift velocity of the charge carriers is above a corresponding threshold value, an oscillating current is generated in the semiconductor, the oscillating frequency being above 100 mc. and having a value dependent upon the shape and length of the semiconductor piece and by the magnitude of the electric field. This phenomenon was discovered by J. B. Gunn in GaAs and InP (IBM Journal, vol. 8, No. 2, April 1964, pages 141–159), a device utilizing this phenomenon now being called Gunn-effect oscillator.

The mechanism of the phenomenon has not yet been fully explained. The conditions heretofore known are that the drift velocity of the charge carrier, which heretofore has been the electron, must be above a threshold value, and that the crystal of GaAs or InP, these being the only substances so far used successfully in this manner, must be short in the direction of the applied voltage, namely shorter than 300$\mu$, in order to afford the generation of coherent oscillations.

Since in the known devices the electron constitutes the majority carrier, the current oscillation in the semiconductor is obtained chiefly by providing an n-type crystal of GaAs with an ohmic contact and applying a sufficient voltage to the contact for producing the necessary electrical field and accelerating the charge carrier within the GaAs.

Figure 1:
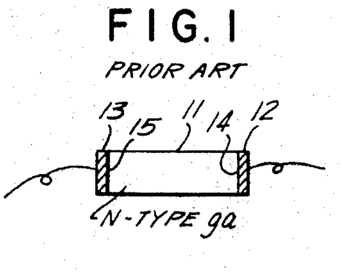

The fundamental structure of such a device is schematically illustrated in FIG. 1 in which the semiconductor body 11 consists of an n-type single crystal of GaAs with ohmic contact electrode 12 and 13 at both ends. When applying voltage between the contacts, the electric current flowing in the semiconductor crystal 11 is carried by the conduction electron constituting the majority charge carrier, and the current intensity is determined by the carrier concentration of the semiconductor. The oscillation frequency is nearly inversely proportional to the length of the crystal piece 11 in the direction of the applied voltage and consequently to the distance between the ohmic contacts 14 and 15.

For high-frequency oscillation the semiconductor piece must be extremely thin. For example, it has been reported that an oscillation of 4.3 gc. was obtained with a thickness (length) of only 50$\mu$ between the ohmic contacts. As mentioned, III-V semiconductors, being compounds of metals from the second subgroups in the third and fifth groups respectively of the periodic system, are most suitable, particularly the two substances mentioned above. However, it is very difficult to provide an ohmic contact on compound materials of this kind, except in cases where the specific resistance is extremely low, i.e. the semiconductor is given an extremely high dopant concentration. Furthermore, it is extremely difficult in practice to produce an ohmic contact on any semiconductor piece of such a slight thickness and to also secure the required high precision, an attempt toward this end being only rarely successful.

It is further necessary to provide for high electric field strength, such as 2000 to 5000 v./cm., and the electric current flowing through the semiconductor in such a field is very large so that the heat losses are enormous. For example, at a carrier concentration of $10^{16}$ per cm.$^3$ the heat consumption is more than 2000 watts per cm.$^3$. Such an extreme heat generation can be prevented by increasing the specific resistance, reducing the dopant concentration, but, as mentioned, this makes it infeasible to provide the semiconductor with the ohmic contacts. Moreover, the specific resistance of n-type GaAs as presently available is but a few ohm-cm. or less. This means not only that the efficiency is low but also that the device cannot by far operate continuously; and even if continuous operation were possible, a reasonably large output would not be available and the life of the device would be very short.

For the reasons explained, the known Gunn-effect device, from practical viewpoints, has considerable deficiencies as to available methods of manufacture and severe defects in operating characteristics. Particularly from the viewpoint of efficiency and output power, both important for a high-frequency oscillator, this type of device still leaves much to be desired.

It is an object of my invention, therefore, to facilitate the manufacture of Gunn-effect oscillators and to increase the efficiency and output of such oscillators. Another, related object is to afford the production of a device for operation at a desired frequency, while securing a high precision and uniformity of the products. It is also an object of the invention to devise a Gunn-effect oscillator operating at a considerably reduced heat loss.

To achieve these objects, and in accordance with my invention, I provide the semiconductor device of the Gunn-effect oscillator with three regions which form two electronic discontinuity junctions of asymmetrical conductance, such a two p-n junctions, or one p-n junction and one rectifying metal-semiconductor (M-S) junction, or two M-S junctions, the intermediate region consists of a III-V monocrystalline semiconductor compound, preferably GaAs or InP. The device thus is of the type p-n-p, n-p-n, p-n-M, n-p-M or M-S-M. The two outer regions of the device are provided with ohmic contacts and the voltage is applied between these contacts and given a sufficient magnitude to produce a depletion layer in the intermediate region and to cause this depletion layer to be in a punch-through state. As a result, charge carriers become injected through one of the two junctions from the exterior of the intermediate region, and a current oscillation is generated in the intermediate region by applying thereto an electrical field whose strength is above the abovementioned threshold valve.

A significant distinction of such a device from the Gunn-effect oscillators heretofore known is the fact that the frequency of the oscillating current is not determined by the size or length of the entire distance between the outer ohmic contacts that supply the field-producing voltage, but that this frequency is determined only by the size (thickness) or shape of the intermediate region in which the depletion layer occurs. The basic conditions to be satisfied by the device are the possibility of producing a sufficiently high electrical field in the intermediate region, giving the semiconductor intermediate region a size, particularly thickness, in accordance with the frequency of the oscillations to be generated, and also that the material is a III-V compound, particularly GaAs or InP. Preferably the majority carrier in the intermediate region is the electron.

For further explaining the invention, the semiconductor devices shown in FIGS. 2, 3 and 4 will now be described.

Figure 2:
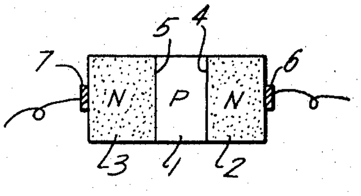
FIG. 2 shows schematically, and by way of example, the semiconductor device of a Gunn-effect oscillator according to the present invention.

The device shown in FIG. 2 comprises a monocrystalline semiconductor body so doped as to have an intermediate region 1 of *p* conductivity type and two outer regions 2 and 3, both of *n* conductivity type. Only the outer regions are provided with terminal electrodes 6 and 7, respectively, which form ohmic contacts. As will be explained, the middle region 1 is to operate as a depletion layer. Accordingly, it has a relatively low dopant concentration, in contrast to the high dopant concentration in the outer layers 2 and 3. It will be seen that one of the two rectifying p-n junctions 4 and 5 formed by the intermediate region 1 with the respective adjacent regions 2 and 3 is reversely biased when the other junction exhibits forward conductance.

Figure 3:
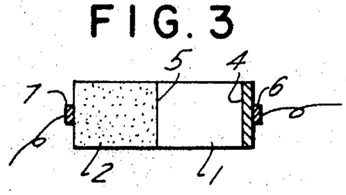
FIGS. 3 and 4 show schematically two further embodiments of oscillator devices according to the invention.

In the device shown in FIG. 3, the intermediate region 1 of semiconductor material to serve as depletion layer forms a p-n junction 5 with a highly doped region 2 in the same monocrystalline body of semiconductor material. The region 1 further forms an S-M junction 4 with a metallically conducting region 3. The outer regions 2 and 3 carry terminal electrodes 6 and 7 with which they form ohmic contacts.

Figure 4:
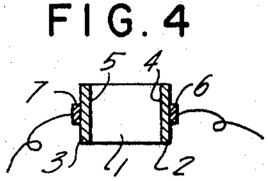

In the device of FIG. 4, the intermediate region 1 of monocrystalline semiconductor material forms two S-M junctions 4 and 5 with metallically conducting outer regions 2 and 3 which carry respective terminal electrodes 6 and 7.

The proper circuit connections and operations of these devices to enable said devices to perform as high-frequency oscillators will be described in conjunction with the following explanations.

The above-mentioned electrical field in the intermediate region of the illustrated devices is obtained by applying between the terminal electrodes a voltage which, with reference to the length of the intermediate region in the direction of the applied voltage, is sufficiently high to make the intermediate region substantially a depletion layer in which no appreciable quantity of charge carriers is available to carry an appreciable amount of current. This is made possible by providing the device, in addition to the forwardly conducting junction, with a reversely biased asymmetrically conducting junction such as a p-n junction within the semiconductor crystal or an M-S rectifying junction between metal and semiconductor.

In order to obtain a high-frequency oscillating current in the depletion layer, it is necessary to inject charge carriers into this region. There are several methods of doing this. One of them is the method of luminous injection, namely exposing the intermediate region of the semiconductor device to light or other electromagnetic radiation. This method can be applied if the device is to operate, for example, as a photoelectrically responsive sensing member. A second way of injecting charge carriers into the depletion region is the use of the avalanche effect. Still another method is to raise in some suitable manner the minority carrier concentration near the depletion layer and thus causing a flow of carriers in the direction of the depletion layer.

The method of charge carrier injection by luminous irradiation does not lend itself well to other than the above-mentioned specific applications because it aggravates the possibilities of mounting the device and requires particular ambient conditions requiring the provision of a light source. This renders the oscillator rather complicated and not necessarily superior to other types of light-responsive devices available, so that some of the objects of the present invention are not satisfactorily met in this manner. The method of charge carrier injection by avalanche effect is objectionable in practice because it lacks uniformity and sufficient stability. The method of raising the minority carrier concentration near the depletion layer results in a transistor design requiring an electrode and circuit connection for the intermediate layer, and the frequency limit then encountered is that of a transistor so that the object of greatly increasing the frequency limit is not achieved.

Another method, preferred for the purposes of the present invention, is to provide the two rectifying junctions, particularly the blocking p-n junction or M-S junction, at respective positions that correspond to the width of the depletion layer obtaining when the electrical field in this layer has reached or exceeded the above-mentioned threshold value. When thus the intermediate region forms substantially entirely the depletion layer and the then applied voltage has the minimum value required by the threshold field in the semiconductor, then any further increase in voltage will cause an injection of charge carriers from one of the outer regions over the potential barrier or by the tunnel effect. This is the injection mechanism utilized in any of the semiconductor devices exemplified by those illustrated in FIGS. 2, 3, 4 and apparent from the energy level diagrams exemplified by FIGS. 5, 6 and 7.

Figure 5:
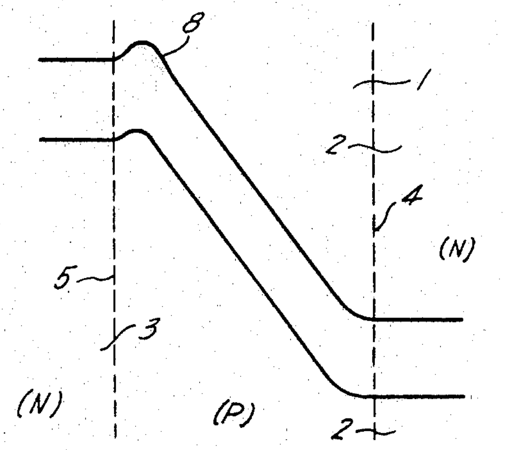
FIGS. 5, 6 and 7 are explanatory graphs of energy level diagrams relating to oscillators according to FIGS. 2, 3 and 4.
Figure 7:
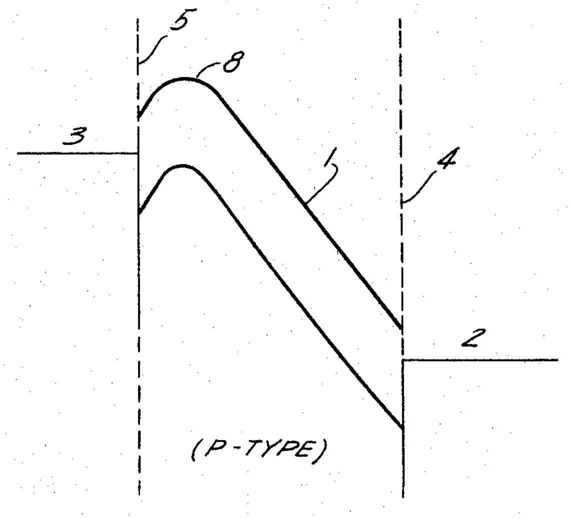
Figure 6:
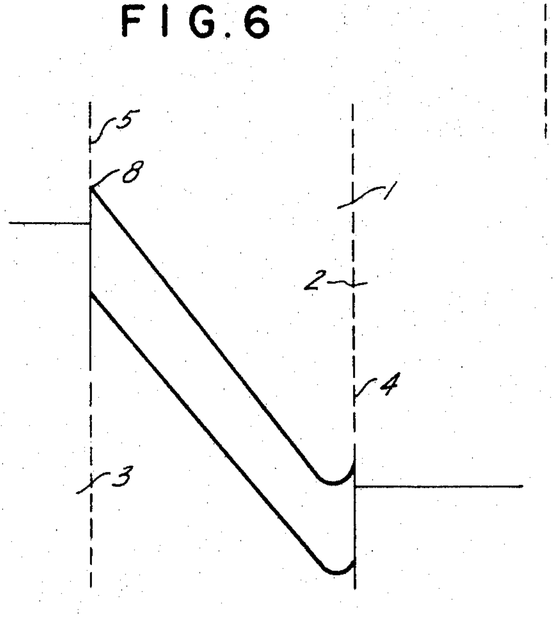

In FIGS. 5 to 7 the horizontal direction or abscissa is indicative of position, the positions of the junctions 4 and 5 being represented by horizontally spaced broken lines between which the intermediate region and hence the operational depletion layer 1 is located. The locations of the respective outer regions are denoted by 2 and 3 in analogy to the designations used in FIGS. 2 to 4.

More specifically, the energy level diagram of FIG. 5 relates to a semiconductor oscillator device as shown in FIG. 2 and represents the operating condition at which the intermediate region 1 of the device has just punched through. It will be remembered that in this case both junctions 4 and 5 are p-n junctions, the semiconductor device being of the n-p-n type. Since the depletion layer is just in the punch-through state, the slopes of the energy curves in region 1 are indicative of the threshold field required. If the applied voltage is raised to a further extent, the maximum 8 of the potential becomes lower, and electrons are injected into region 1 from the region 3 through the junction 5.

The energy diagrams shown in FIGS. 6 and 7 relate to devices of the type shown in FIGS. 3 and 4. In both cases, the intermediate depletion layer in the semiconductor region is located between high-conductance regions 2 and 3. In both diagrams the electric field in the depletion region, caused by the applied voltage, has reached the threshold value corresponding to the performance explained with reference to FIG. 5. The case represented by FIG. 6 relates to an operation in which the further increase in voltage results in the Schottky effect or the force of image by inversion, the maximum 8 of the potential is lowered and electrons are thus injected from the region 3, or the potential barrier at the position of the maximum 8 becomes thin so that electrons are injected from region 3 through junction 5 into region 1 by the tunnel effect.

Consequently, the voltage in such a device is applied independently of the current until the necessary electrical threshold field is produced; and the charge carrier is not injected before the punch-through voltage is exceeded. As a result, the charge carrier flowing in the intermediate region 3 is injected from the outer region independently of acceleration and voltage and can be controlled by the amount of voltage that exceeds the punch-through voltage threshold.

When injection has occurred, the carrier velocity satisfies the above-mentioned critical minimum in region 1 so that, as explained, an oscillating current will be generated if the other conditions are also met. When thus an electric current flows through region 1 into the high-concentration or metal region 2, the current flows by virtue of majority carrier conduction within the material of the layer 2 and the carrier velocity decreases extraordinarily.

For this reason, when the current enters into the adjacent outer layer, the condition or property of the conducting medium is fundamentally different so that the conditions relating to the propagation of the carrier and the energy state in the intermediate region no longer exist. The mechanism of conductance in the outer region rather is the normal majority carrier conduction mechanism for transmitting signals. In other words, the propagation constant in the state which generates oscillation in the region 1 is greatly different from the propagation constant in the outer region 2 or 3. Consequently, the junction faces 4 and 5 constitute boundaries or discontinuity faces for the propagation of electrons or for the above-mentioned energy state. This is the reason why in devices according to the invention, the oscillation generating conditions between these discontinuity or reflection faces are satisfied.

A device whose oscillatory mechanism and structure are as described above, affords various advantages. In the first place, since the carrier concentration in region 1 can be controlled, this concentration can be readily selected at the point where efficiency is an optimum or where the output is a maximum, taking heat radiation into account. As a result, the efficiency of such oscillators is improved and the output correspondingly increased. Furthermore, the ohmic contacts do not involve any particular problems because they are made at high-concentration regions or metals.

If the junctions 4 and 5 are p-n junctions, they can be readily produced by the techniques conventionally employed in the manufacture of transistors and diodes. The thickness or length in the voltage direction of the intermediate region 1 of semiconductor material corresponds to that of the thin films used in conventional transistors and diodes and therefore can be produced by the same techniques with extremely high precision, in the required thicknesses of less than $1\mu$ up to about $100\mu$. Furthermore, it is comparatively easy to give the small body of the junction device a very slight thickness, in which case the application of the vapor deposition method is available to readily produce M-S junctions of good quality. The epitaxial growing process is applicable for producing p-n junctions. The material of the semiconductor intermediate region is preferably a III–V semiconductor compound of an element from the third group of the periodic system with an element of the fifth group, although so far we have used only GaAs and InP which appear to be best suitable. While theory shows that the Gunn effect is producible with p-type and n-type material, the GaAs and InP compounds heretofore used were n-type materials. We have ascertained this only to the extent that the invention is realized particularly effectively if the charge carrier is the electron. Thus, it is advisable in a device according to FIG. 2 to have the intermediate region 1 weakly doped for conductivity type to obtain the abovedescribed effect by means of electron injection. Devices as exemplified by FIGS. 3 and 4 should be analogously constructed so that the charge carriers injected into the semiconductor region 1 are electrons. For example, an operation in accordance with the diagram shown in FIG. 6 makes it advisable to employ a device according to FIG. 3 or FIG. 4 in which the intermediate region 1 is formed of n-type GaAs and the outer regions 2 and 3 are formed of gold.

An embodiment of the invention will now be described more in detail with reference to the n-p-n device shown in FIG. 2.

Relative to the desired frequency of the high-frequency oscillations to be generated in a device according to FIG. 2, the required thickness value or length in the direction of applied voltage of the intermediate region 1 is available from the data published by J. B. Gunn in the abovecited publication. For generating current oscillations, the following expression must be roughly satisfied:

$$\frac{qNW}{2K} \leqq Ec \qquad (1)$$

wherein $q$ denotes the elementary charge of an electron, N the impurity concentration of region 1 in atoms/cm.$^3$, W the thickness of region 1, K the dielectric constant of the semiconductor material of region 1, and E$c$ the necessary median value of the electric field corresponding to the above-mentioned critical value. The voltage V which must be impressed across the device for producing the critical field E$c$ is given by the equation:

$$V = \frac{qNW^2}{2K} \qquad (2)$$

Since it is virtually impossible to control the concentration N with high precision, it must be made slightly higher than the required minimum value. This ensures that the electric field exceeds E$c$ when punch-through occurs.

Processes of manufacturing a device meeting the just-mentioned requirements will now be described with reference to the generation of high-frequency oscillations of 4000 mc. The corresponding suitable thickness of the intermediate region, made of III-V compound, is $W=55\mu$.

For manufacture of he device, the diffusion technique or the epitaxial technique are preferably employed.

(1) The diffusion technique is applied for example as follows: (a) A wafer or film of n-type GaAs having a thickness, for example, of $90\mu$, and a sufficiently low specific resistance, for example, 0.05 ohm-cm., as used. An acceptor impurity such as Zn is diffused from one surface of the material (at the left in FIG. 2) down to a depth of about $70\mu$ to thereby form a p-n junction corresponding substantially to the one denoted by 4 in FIG. 2. The average concentration of the acceptor is given a value corresponding to the Expression 1, (b) thereafter a donor, for example Sn or Te, is diffused from the same or left-hand surface into the semiconductor crystal, but down to a smaller depth of only $15\mu$, preferably at highest feasible average concentration. In this manner a junction is produced at a location corresponding to the one denoted by 5 in FIG. 2. As a result, a p-type intermediate region 1 of the desired width of $55\mu$ is obtained, and (c) electrodes forming ohmic contacts are then attached in a conventional manner.

(2) Another way of applying the diffusion method is to diffuse dopants from both surfaces of the monocrystalline body. If the intermediate layer, as in the present case, is to be relatively thick, such as $55\mu$, it is preferable to diffuse the donor impurity simultaneously from both surfaces of the semiconductor wafer. For example, donor impurity such as Sn is diffused simultaneously from both surfaces of a p-type GaAs wafer down to a depth of $17.5\mu$. This also results in n-p-n types represented in FIG. 2.

(3) The epitaxial method may be applied as follows: The same starting material is used as in Example 1(a), and a p-type layer of a desired specific resistance is grown on top of the wafer in a thickness of $50\mu$. Thereafter, an n-type layer of low specific resistance is grown on top of the previous layer up to a thickness of 10 or $20\mu$. This completes the configuration represented in FIG. 2, and the ohmic contacts are then added in conventional manner.

Devices of the type shown in FIGS. 3 and 4 are of particular advantage in cases where the intermediate region 1 of semiconductor material is readily available for other reasons, such as in cases where the devices are assembled in thin-film circuits, micro-circuits and other integrated circuits. It is relatively easy in such cases to produce a rectifier M-S junction on a semiconductor region 1, such as a substrate of an integrated circuit, having a high specific resistance. If this layer or substrate 1 consists of n-type GaAs, for example, M-S junctions of good quality can be readily obtained by vacuum evaporation of Au.

As mentioned, devices according to the invention afford making full use of manufacturing as well as operating techniques known for transistors and diodes. A device of the type shown in FIG. 2, for example, is favorably applicable in microwave circuits such as waveguides, cavity resonators and strip lines as well as the normal lumped-constant type circuits. Devices of the type shown in FIGS. 3 and 4 are also conveniently applicable as components of subassemblies for ultra high frequencies.

Figure 8:
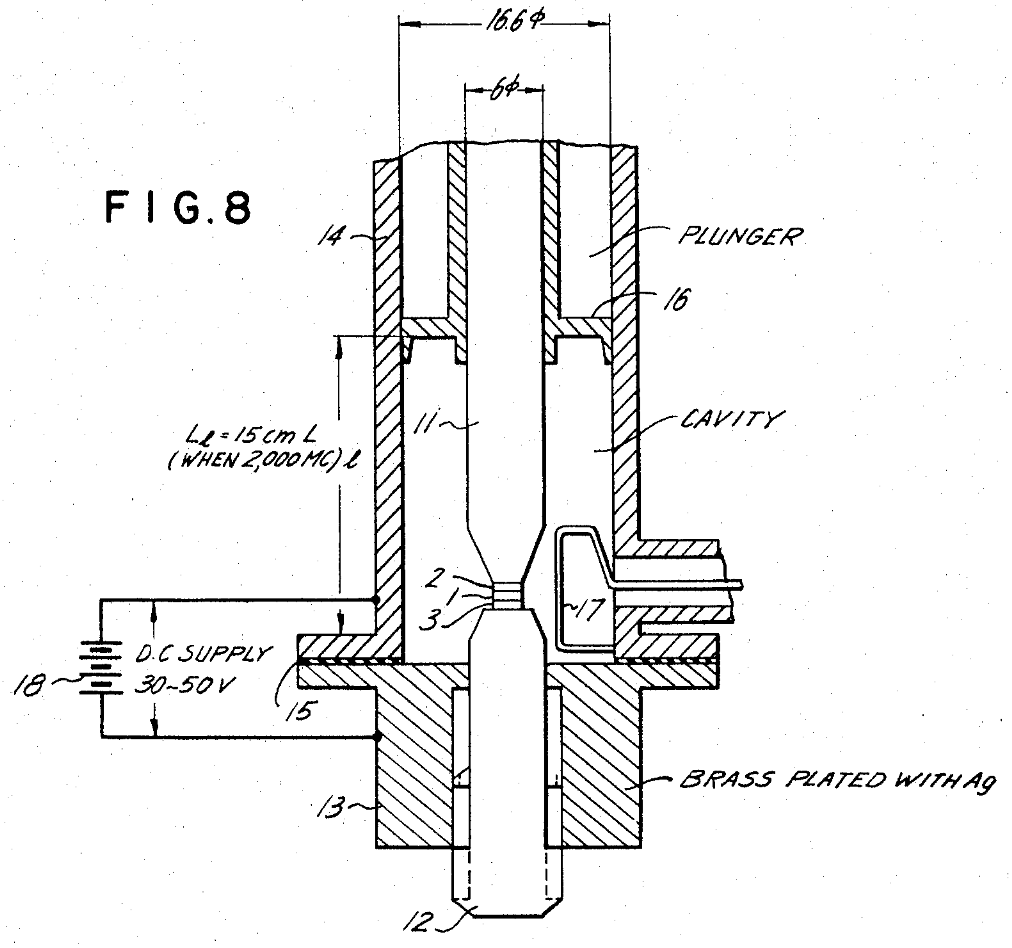
FIG. 8 shows in section an oscillator including a device according to FIG. 2.

An embodiment of a cavity resonator according to the invention is illustrated in FIG. 8. A semiconductor device as shown in FIG. 2 is connected between the inner conductor 11 of the resonator and a conducting member 12 seated in a closure 13 of metal. The closure member 13 is insulated from the outer conductor 14 of the resonator by a thin sheet 15 of tetrafluorethylene which is available under the trade name Teflon, of 100-micron thickness. The other end of the cavity is short-circuited by a displaceable plunger 16. The high frequency oscillations generated in the semiconductor device are coupled out of the resonator by means of a loop 17 which may be connected through a coaxial cable to a load, for example, of 50 ohms. For generating a frequency of 2,000 mc., a source of 30–50 v. DC is connected between member 13 and outer conductor 14, and the length L of the cavity is set to 15 cm.

I claim:

1. An oscillator comprising a semiconductor device having three regions and two asymmetrically conductive junctions between the intermediate region and the respective outer regions, said intermediate region being formed of III–V semiconductor compound, said device having respective terminal contacts on said outer regions; circuit means connected to 18 said contacts and having between said contacts a voltage V which at least at repetitive moments corresponds to the magnitude $$V=qNW^2/2K$$

wherein $q$ denotes the elementary charge, N the semiconductor impurity concentration in atoms per cm.$^3$, W the thickness of the semiconductor region in Cm., and K the dielectric constant of the semiconductor, said voltage causing a depletion layer to be formed in said semiconductor region and to attain punched-through state, whereby a high frequency current oscillation is produced in said device.

2. In an oscillator according to claim 1, said intermediate region being formed of one of the group consisting of gallium arsenide and indium phosphide.

3. In an oscillator according to claim 2, said intermediate region being of p-conductivity type.

4. In an oscillator according to claim 2, said two outer regions consisting of semiconductor material, and each of said two junctions being a p-n junction.

5. In an oscillator according to claim 2, said outer region being formed of metal and semiconductor material respectively.

6. In an oscillator according to claim 2, said two outer regions being formed of metal.

7. In an oscillator according to claim 2, said intermediate region having a thickness from about 1 micron to approximately 50 microns.

8. In an oscillator according to claim 2, at least one of said outer regions being formed of gold.

References Cited

UNITED STATES PATENTS

| | | | |
|---|---|---|---|
| 2,899,646 | 8/1959 | Read | 331—107 |
| 2,914,665 | 11/1959 | Linder | 331—107 |
| 2,975,377 | 3/1961 | Price et al. | 331—107 |
| 3,040,188 | 6/1962 | Gaertner et al. | 331—107 |
| 3,160,828 | 12/1964 | Strull | 331—107 |
| 3,270,293 | 8/1966 | De Loach et al. | 331—107 |

JOHN KOMINSKI, *Primary Examiner.*

U.S. Cl. X.R.

317—234; 331—96